(12) United States Patent
Oppermann

(10) Patent No.: US 8,188,548 B2
(45) Date of Patent: May 29, 2012

(54) DEVICE AND METHOD FOR REDUCING A VOLTAGE DEPENDENT CAPACITIVE COUPLING

(75) Inventor: Klaus-Guenter Oppermann, Holzkirchen (DE)

(73) Assignee: Infineon Technologies AG, Munich (DE)

(*) Notice: Subject to any disclaimer, the term of this patent is extended or adjusted under 35 U.S.C. 154(b) by 619 days.

(21) Appl. No.: 11/706,558

(22) Filed: Feb. 15, 2007

(65) Prior Publication Data

US 2008/0197423 A1 Aug. 21, 2008

(51) Int. Cl.
*H01L 29/78* (2006.01)
(52) U.S. Cl. ......... 257/386; 257/E29.255; 257/E21.409; 257/E27.006

(58) Field of Classification Search .......... 257/386, 257/E29.255, E21.409; 438/197
See application file for complete search history.

(56) References Cited

U.S. PATENT DOCUMENTS

| | | | | |
|---|---|---|---|---|
| 6,013,926 A * | 1/2000 | Oku et al. | | 257/284 |
| 6,496,085 B2 * | 12/2002 | Ella et al. | | 333/189 |
| 2004/0174091 A1 * | 9/2004 | Robert et al. | | 310/320 |
| 2005/0104690 A1 * | 5/2005 | Larson et al. | | 333/191 |
| 2005/0237132 A1 * | 10/2005 | Sano et al. | | 333/189 |
| 2008/0169728 A1 * | 7/2008 | Asai et al. | | 310/334 |
| 2009/0152997 A1 * | 6/2009 | Furue et al. | | 310/365 |

* cited by examiner

*Primary Examiner* — Marc Armand
(74) *Attorney, Agent, or Firm* — Maginot, Moore & Beck

(57) ABSTRACT

A device comprises a first means for separating a conductive layer from a semiconductor substrate and a second means for reducing a voltage dependent capacitive coupling between the conductive layer and the semiconductor substrate.

25 Claims, 4 Drawing Sheets

DEVICE AND METHOD FOR REDUCING A VOLTAGE DEPENDENT CAPACITIVE COUPLING

BACKGROUND

The present invention relates to a device and a method for reducing a voltage dependent capacitive coupling.

BAW filters and/or BAW resonators formed on a semiconductor base material, such as, for example, silicon, are passive electrical RF devices usually operated in the gigahertz range. BAW resonators exemplarily comprise a bottom electrode and a top electrode separated by a piezoelectric layer and, when applying the resonant frequency, the result will be standing acoustic waves in the BAW resonator. Depending on the material and a layer thickness of the piezoelectric layer, the result will be resonance in the high-frequency band (usually in the gigahertz range). Due to the high frequency, a series of capacitive couplings which are usually undesired and are to be avoided may occur. Examples of this are capacitive couplings between individual conductive tracks or capacitive couplings relative to an electrode of the BAW filter or even via an electrically conductive substrate material.

Capacitive couplings between pads or conductive tracks can, for example, be minimized by a suitable design of pads and conductive tracks. Another way is using a high-resistance semiconductor material (such as, for example, lightly doped semiconductor material) as the substrate material so that capacitive coupling between metal layers via the substrate material can be avoided due to the high electrical resistances of the substrate. A disadvantage resulting from using a lightly doped semiconductor material is, for example, a voltage-dependent substrate capacitance C(U) occurring between metallic patterns in the BAW filter and the substrate. The voltage-dependent substrate capacitance C(U) is generated by the surface effect at metal-oxide semiconductor (MOS) interfaces or boundary surfaces, as is known from MOS transistors.

SUMMARY

Embodiments of the present invention comprise a device with a first means for separating a conductive layer from a semiconductor substrate and a second means for reducing a voltage dependent capacitive coupling between the conductive layer and the semiconductor substrate.

BRIEF DESCRIPTION OF THE DRAWINGS

Preferred embodiments of the present invention will be detailed subsequently referring to the appended drawings, in which.

Figure 1:
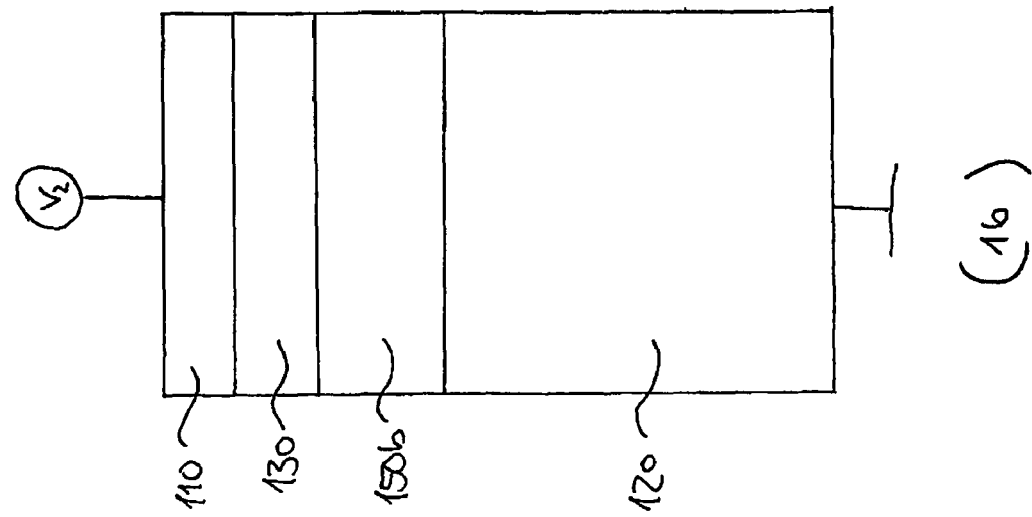
FIG. 1 is a cross-sectional view of an MOS structure without any surface doping including a voltage-dependent depletion zone.
Figure 1:
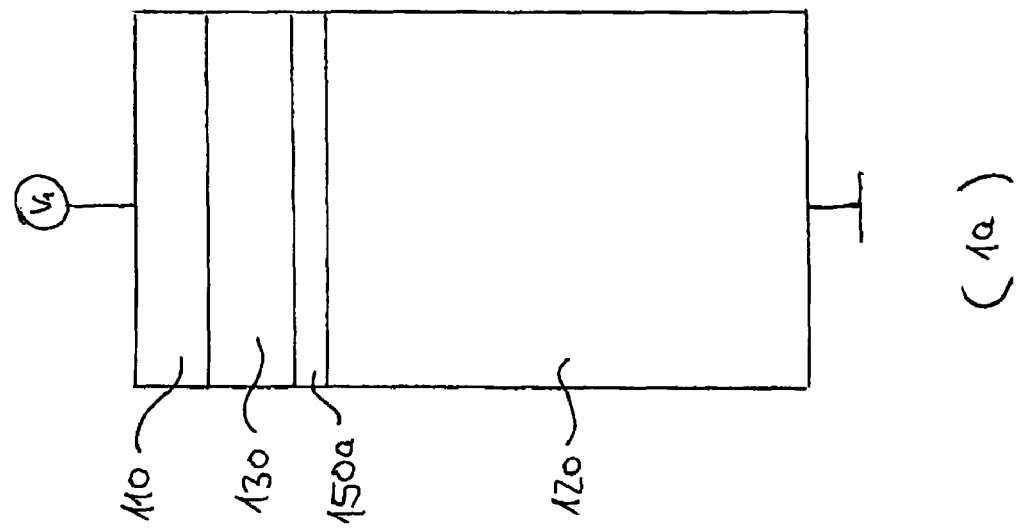
Figure 1:
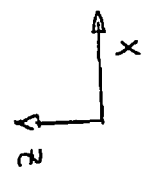

Before explaining embodiments of the present invention in greater detail below referring to the drawings, it is pointed out that same elements or elements having the same effect are provided with same or similar reference numerals in the figures and that a repeated description of these elements is omitted.

DETAILED DESCRIPTION

Embodiments of the present invention relate to a device for reducing a voltage dependent capacitive coupling between a conductive layer and a semiconductor substrate, the device comprising an insulating layer and the insulating layer electrically separating the conductive layer and the semiconductor substrate. In addition, the device comprises a boundary layer arranged between the insulating layer and the semiconductor substrate. The boundary layer comprises an electrically conductive material or a semiconductor material, the semiconductor material comprising a doping concentration that is higher than a doping concentration of the semiconductor substrate.

In further embodiments, the boundary layer comprises a lateral extension and hence is formed two-dimensionally on a surface, for example facing the insulating layer, of the semiconductor substrate with a layer thickness. The layer thickness of the boundary layer is selected such that a lateral area charge density corresponds at least to a breakdown charge density of the semiconductor substrate. It is, however, of advantage if the layer thickness is significant bigger, e.g. up to the $10^3$-fold thereof. The boundary layer can be arranged on the semiconductor substrate by forming a separate layer on the surface of the semiconductor substrate. Alternatively, the boundary layer may be arranged in the semiconductor substrate by doping the surface up to a depth corresponding to the layer thickness of the boundary layer. The layer thickness can be, e.g., around or less than 100 nm, around or less than 1 μm or several microns (e.g. less than 100 μm). To ensure the above-mentioned lateral area charge density the doping concentration of the boundary layer should be significantly higher than a possible doping concentration of the semiconductor substrate (e.g. by at least one order of magnitude).

The boundary layer may be patterned such that it substantially "mirrors" the conductive layer, i.e. the boundary layer comprises a planar dimension, which corresponds substantially to a planar dimension of the conductive layer and the relative lateral position of both layers agrees to an accuracy of less than 40% or advantageously less than 10%. Thus, the boundary layer is patterned such that it extends between the conductive layer and the semiconductor substrate with a tolerance of, for example, +/−40% or advantageously +/−10%. This arrangement of the boundary is of advantage, since different structures and/or other devices, which are integrated in the semiconductor substrate, remain electrically separated (thereby avoiding for example of short circuits). Further embodiments comprise a plurality of conductive layers and a plurality of boundary layers so that each boundary layer is associated with one conductive layer of the plurality of conductive layers.

In further embodiments, the conductive layer is part of a high frequency device. The conductive layer comprises, for example, a bottom electrode of a BAW resonator, which in addition comprises a piezoelectric layer and a further conductive layer (e.g. a top electrode) that are formed on the conductive layer. The BAW resonator is formed such that the conductive layer and the further conductive layer are separated by the piezoelectric layer, wherein the further conductive layer and the conductive layer may comprise a metal, such as aluminum or tungsten (or may even comprise several layers). In further embodiments, the conductive layer includes a conductive track or a contact pad providing an electrical contact for a device.

Embodiments of the present invention also include a method of reducing a voltage dependent capacitive coupling. The method includes the steps of providing a boundary layer comprising a conductive material or a doped semiconductor material, wherein the doping may include tempering. In addition, the method may comprise a structuring of the boundary layer, wherein the structuring includes, for example, using a photolithographic technique with a mask.

The boundary layer may be produced by a heavily doped region ($N \sim 10^{20}$ cm$^{-3}$) in a lightly doped semiconductor base material ($N \sim 10^{14}$ cm$^{-3}$). Thus, the occurrence of a strongly voltage-dependent capacitance $C(U)$ between conducting regions above the substrate and the substrate is prevented. The heavy doping concentration is located directly at an interface between the substrate wafer surface and insulator material above it (for example silicon oxide). Attention should be paid to the depth of the heavy doping concentration in the substrate wafer. This means specifically that the depth of doping being low in order to minimize the capacitive coupling between the doping zones, i.e. between the boundary layer and the semiconductor substrate. In addition to the upper limit, a lower limit of the depth can be obtained again from the lateral area charge density, which can be calculated as an integral of the doping along the doping profile into the substrate up to the depth of the doping. The lateral area charge density should again considerably exceed the breakdown charge of around $2*10^{12}$ cm$^{-2}$ required for silicon.

Embodiments of the present invention thus comprise patterned heavily doped regions below the metal structures of the exemplary BAW filters and serve as suppression of the voltage-dependent capacity. Before BAW-typical layer sequences of different materials are applied on the substrate wafer (e.g. lightly p-doped silicon with $N=10^{14}$ cm$^{13}$), high doping regions (exemplarily heavily p-doped of at least $N=10^{17}$ cm$^{-3}$ or better with $N=10^{19}$ cm$^{-3}$ to $N=10^{20}$ cm$^{-3}$) can be generated selectively using a photolithographic technique and subsequent implantation. After that, the substrate is tempered, i.e. subjected to a suitable temperature to electrically activate the dopants. The subsequent layers of the BAW resonator are set up and patterned in another process flow.

In further embodiments the boundary layer is produced by forming an additional semiconductor layer on the semiconductor substrate, wherein the additional semiconductor layer comprises a doping concentration, which obeys same limitations as explained before for the boundary layer.

Embodiments of the present invention thus offer an improvement in filter characteristics of a BAW (bulk acoustic wave) filter formed on a semiconductor base material by producing locally heavily doped regions below pads, conductive tracks and resonators and, in addition, offer the advantage of efficiently suppressing voltage dependent capacitive couplings in an MOS structure, which can be really disturbing in particular in high-frequency range applications and. The advantage achieved by this is obtained particularly with a simple process management and thus at low cost.

FIG. 1 shows a cross-sectional view of an MOS structure along an xz-plane including a conductive layer 110, an insulating layer 130 and a semiconductor substrate 120. In FIG. 1a, a voltage $V_1$ is applied to the conductive layer 110 and in FIG. 1b a voltage $V_2$ is applied to the conductive layer 110, wherein the semiconductor substrate 120 in both cases is at ground. In the layer sequences shown in FIGS. 1a and 1b, a depletion zone (space charge zone) 150 develops between the insulating layer 130 and the semiconductor substrate 120, when a voltage is applied. In the layer sequences shown in FIG. 1, it is assumed that the first voltage $V_1$ is smaller than the second voltage $V_2$, and consequently a second depletion zone 150b in FIG. 1b along the z-direction is increased compared to a first depletion zone 150a in FIG. 1a. The depletion zones 150 thus are voltage-dependent and evolve at the MOS interface (as a consequence of the field effect).

The insulating layer 130 and the depletion zone 150 make contributions to the capacitance C between the conductive layer 110 and the semiconductor substrate 120. The contributions come from the insulating layer 130 ($C_{SiO2}$) and the depletion zones 150a, 150b ($C_{RLZ}$). Since the depletion zones 150a, 150b are more or less developed depending on an applied voltage the capacitance C is voltage-dependent. Specifically, this means that the following applies for the capacitances:

$$C(V_1) > C(V_2)$$

Thus, the voltage dependent depletion zone 150 comprises a voltage dependent capacitive coupling between the conductive layer 110 and the semiconductor substrate 120. Especially if a high-frequency signal is attached to the conductive layer 110, this is a disturbing feature.

Figure 2:
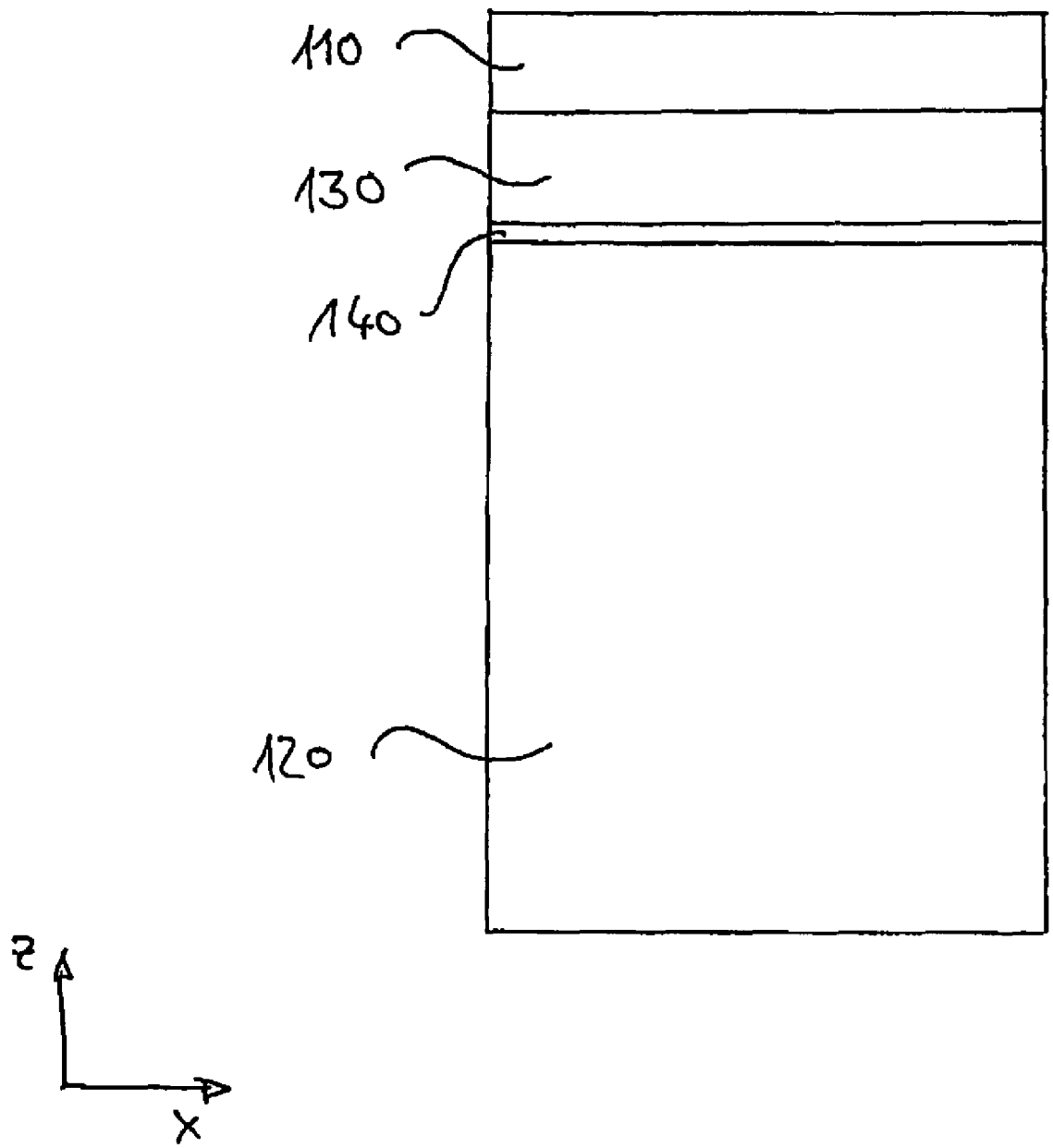
FIG. 2 is a cross-sectional illustration of an MOS structure having a conductive boundary layer according to an embodiment of the present invention.

FIG. 2 shows a cross-sectional view of a device for reducing the voltage dependent capacitive coupling between the conductive layer 110 and the semiconductor substrate 120, which are separated by the insulating layer 130. What is shown is a cross-sectional view along the xz-plane, wherein the z-direction is perpendicular to a layer plane (xy-plane) in which the conductive layer 110 and the insulating layer 130 are arranged on the semiconductor substrate 120. In this embodiment, the insulating layer 130 and the semiconductor substrate 120 are separated from each other by a boundary layer 140. The boundary layer 140 comprises a doped semiconductor material having a higher doping concentration when compared to the semiconductor substrate. The insulating layer 130 serves as an electrical insulation of the conductive layer 110 from the semiconductor material 120 or the boundary layer 140. Advantageously, the boundary layer 140 is patterned such that its extension in the xy-plane nearly coincides with an extension of the conductive layer 110 in this plane, wherein a tolerance of +/−40% or more advantageously +/−10% may occur.

Exemplary materials for the conductive layer 110 are aluminum and silicon oxide for the insulating layer 130. The semiconductor substrate may comprise silicon, which is doped with a concentration of at most $N=10^{16}$ cm$^{-3}$ or at most $N=10^{15}$ cm$^{-3}$, preferably the doping concentration is within a region from $N=10^{13}$ to $10^{15}$ cm$^{-3}$ or approximately $N=10^{14}$ cm$^{-3}$. The boundary layer 140 may be formed by a doping of a surface (surface doping) facing the insulating layer 130 of the semiconductor substrate 120 and in order to ensure a sufficient charge concentration, the doping of the surface should be sufficiently high, i.e. at least $N_{min}=10^{16}$ cm$^{-3}$ or preferably at least $N=10^{18}$ cm$^{-3}$ or $N=10^{20}$ cm$^{-3}$. The doping of the surface should be of the same type as the doping of the semiconductor substrate 120. If the semiconductor substrate 120 is, for example, p-doped silicon, the boundary layer 140 should be highly p-doped silicon.

Specific doping materials (dopants) exhibit specific advantages in the process of forming the boundary layer 140 of a specific thickness. For example a doping with Phosphorus will usually remain at the surface in the tempering process, which is performed to activate the dopants. This simplifies the process of forming the boundary layer 140 with a small thickness. On the other hand, doping with boron requires more effort in order to ensure the specific thickness. A reason for this is, that boron atoms very quickly migrate into an interior region of the semiconductor substrate 120 in the tempering process.

FIGS. 3a and 3b show cross-sectional views of a layer sequence for an embodiment of the present invention which, as is the case in FIGS. 1a and 1b, comprise the conductive layer 110, the semiconductor substrate 120 and the insulating layer 130. In addition, however, the boundary layer 140 which is not present in FIGS. 1a and 1b is formed in the layer sequence of FIGS. 3a and 3b. The effect of the boundary layer 140 is that when applying a voltage V no voltage-dependent depletion zone forms in the semiconductor substrate 120, more explicitly the depletion zone is voltage-independent. Thus, the capacitive coupling between the conductive layer 110 and the semiconductor substrate 120 is also voltage-independent.

Figure 3:
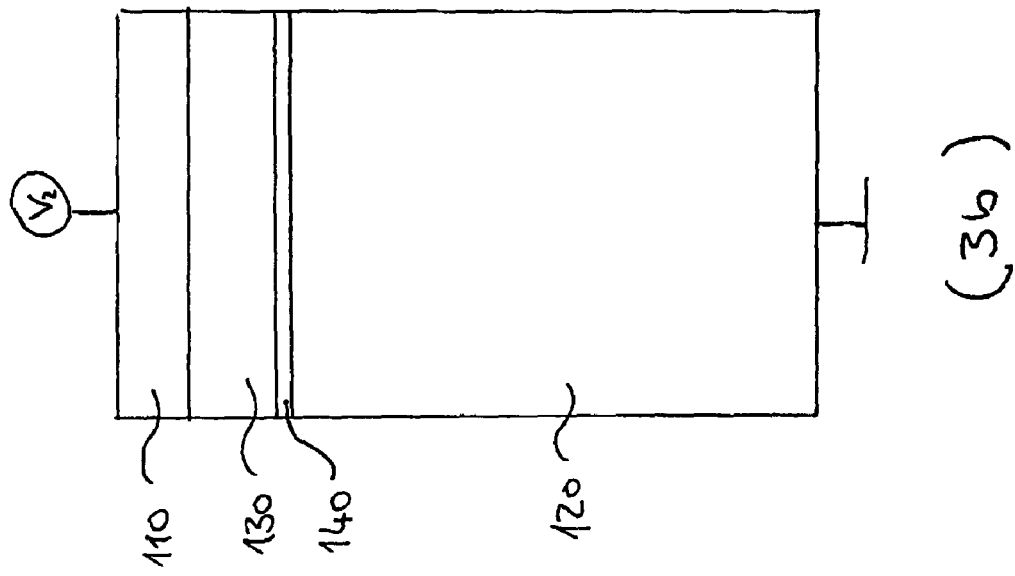
FIG. 3 is a cross-sectional view of an MOS structure including a surface doping and including a voltage-independent depletion zone.
Figure 3:
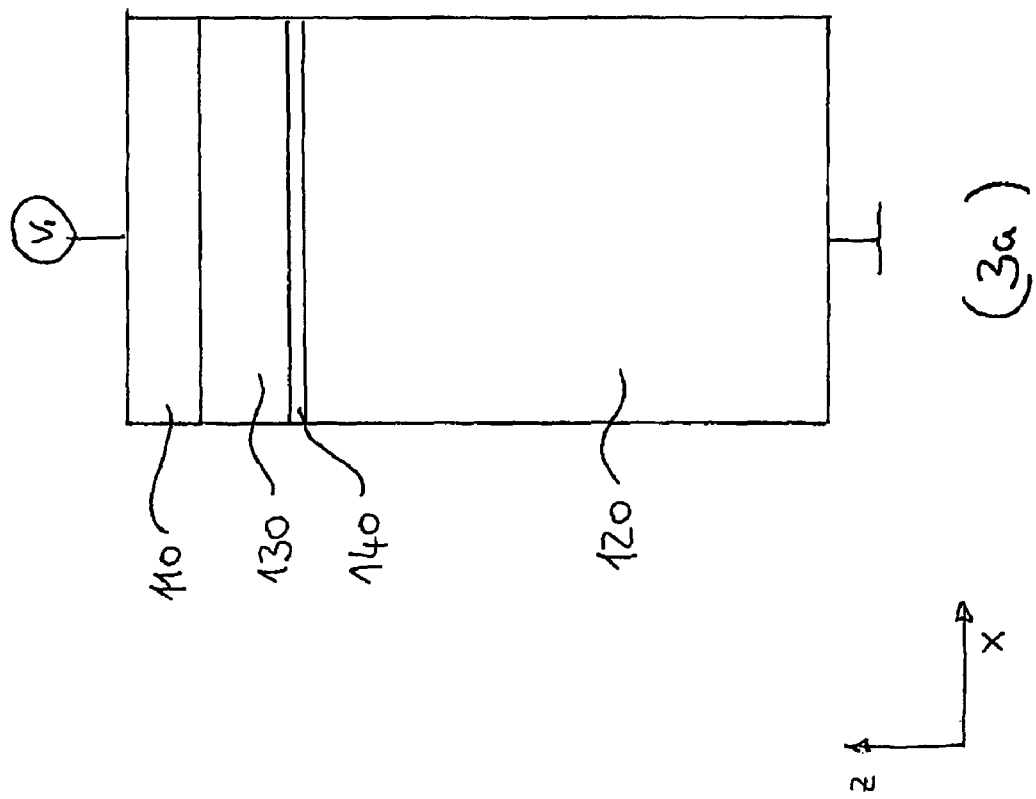

In FIG. 3a, as is the case in FIG. 1a, a voltage $V_1$ is applied to the conductive layer 110 which is smaller than a voltage $V_2$ applied to the conductive layer 110 in FIG. 3b. As before, the semiconductor substrate 120 is at ground. The capacitance $C(V_1)$ of the layer sequence of FIG. 3a obtains contributions from a capacitance of the insulating layer ($C_{SiO2}$) and a capacitance of the depletion zone ($C_{RLZ}(V_1)$). The capacitance $C(V_2)$ of the layer sequence of FIG. 3b also obtains contributions from the capacitances of the insulating layer 130 ($C_{SiO2}$) and the depletion zone ($C_{RLZ}(V_2)$). Since in the embodiment of FIG. 3 there is nearly no voltage-dependent depletion zone, the capacitances are $C_{RLZ}(V_1)=C_{RLZ}(V_2)$, the capacitance of the depletion zone is nearly voltage-independent and consequently the total capacitance of the layer sequence of FIGS. 3a and 3b is the same, i.e.

$$C(V_1)=C(V_2).$$

Thus, the surface doping with a high concentration as given by the boundary layer 140 provides a nearly voltage-independent depletion zone at the MOS interface. This is an important feature of the layout in FIG. 3 (in contrast to the layout in FIG. 1), especially if a high-frequency signal is applied to the conductive layer 110.

Figure 4:
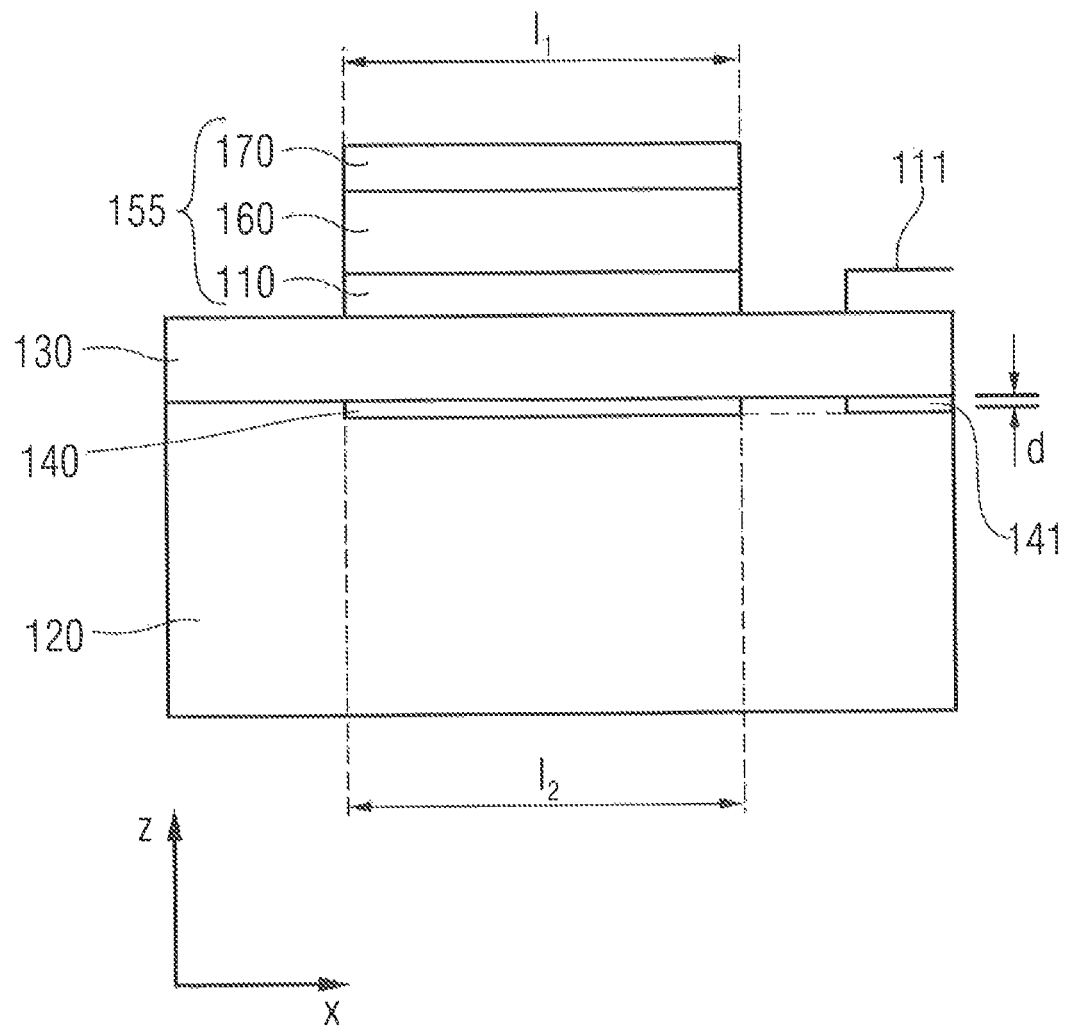
FIG. 4 shows a BAW resonator on a semiconductor substrate including a conductive boundary layer.

FIG. 4 shows an embodiment in which the conductive layer 110 is a bottom electrode of a BAW resonator 155. The conductive layer 110 in turn is formed on an insulating layer 130, wherein the insulating layer 130 is formed on a semiconductor substrate 120 along an xy-plane (the y-direction here is perpendicular to the plane of the drawing of FIG. 4). As can be seen from FIG. 4, a piezoelectric layer 160 and a further conductive layer 170 are formed on conductive layer 110, the piezoelectric layer 160 separating the conductive layer 110 and the further conductive layer 170. The conductive layer 110 forms a bottom electrode and the further conductive layer 170 forms a top electrode of the BAW resonator 155. Along the x-direction, the BAW resonator extends over a first length $l_1$ (an extension of the BAW resonator along the y-direction is not shown in this cross-sectional view). The boundary layer 140 is formed below the BAW resonator 155 (in a negative z-direction) and extends over a second length $l_2$ along the x-direction.

It is of advantage that the lateral extension of the conductive layer 110 corresponds to the extension of the boundary layer 140, which implies that a center position of the conductive layer 110 agrees with a center position of the boundary layer 140 as well as the first length $l_1$ agrees the second length $l_2$ with a tolerance of +/−30% and, preferably, +/−10% (i.e. the boundary layer 140 comprises around the same size with no lateral shift compared to the BAW resonator). In the same manner, a length and position adjustment takes place for an extension along the y-direction, which is not shown in FIG. 4.

By such a structuring or patterning of the boundary layer, potential negative influences as to neighboring structures are prevented. Furthermore, it may be of advantage for the extension of the boundary layer 140, $l_2$, to be selected to be slightly greater than the first extension $l_1$ to suppress capacitive coupling of the conductive layer 110 to the semiconductor substrate 120 more effectively. This will particularly apply for the case that neighboring devices/structures in the semiconductor substrate 120 are not influenced by the boundary layer 140 (for example, when they are in a greater lateral distance). Otherwise, the length $l_2$ is chosen such, that negative interferences with the neighboring devices are minimized. The BAW resonator 155 comprises only an example for a RF-device (high-frequency device) and in a more general case, the conductive layer 110 is part of the RF-device and comprises, for example, an electrode for the RF-device or is connected to one.

With regard to the z-direction, the boundary layer 140 comprises a layer thickness d which is generally selected to be as small as possible to suppress capacitive coupling between the boundary layer 140 and the semiconductor substrate 120. On the other hand, there is a lower limit for the layer thickness d of the boundary layer 140 which is given by the fact that an area charge density with regard to the xy-area of the boundary layer 140 corresponds to at least a breakdown charge density of the semiconductor substrate 120. For an exemplary silicon substrate, the breakdown charge density is about $2*10^{12}$ cm². The area charge density with regard to the xy-plane of the boundary layer 140 can be established by integrating the charge density (=concentration of free charge carriers) of the boundary layer 140 with layer thickness d along the z-direction. If the boundary layer 140 is formed by a doped semiconductor, the lateral area charge density of the boundary layer 140 corresponds to the doping concentration. The minimal value of the layer thickness d thus, on one hand, depends on the doping of the boundary layer 140 and, on the other hand, on the semiconductor substrate or, more precisely, on its breakdown charge density. Summarizing, the two conditions for the layer thickness d, there is a lower threshold value given by the breakdown charge density of the semiconductor substrate 120 and an upper threshold for the layer thickness d is given by a suppression of a capacitive coupling between the boundary layer 140 and the semiconductor substrate 120. An upper limit for d may, for example, be 1000 times the minimal value. Exemplary values for d are: d=100 nm or d=1 µm or d=1 ... 10 µm.

As shown in FIG. 4, further embodiments comprise a plurality of conductive layers 110, 111, ... and a plurality of boundary layers 140, 141, ... so that each boundary layer 110, 111, ... is associated with one conductive layer of the plurality of conductive layers 140, 141, ....

In further embodiments, the boundary layer 140 is not only formed below a BAW resonator 155 but also below conductive tracks or terminal pads. The conductive tracks may, for example, contact the bottom electrode of the BAW resonator. However, to avoid negative electrical influences (such as short circuits) the boundary layer 140 is patterned so that it will basically only exist below the conductive layer 110, which in the absent of the boundary layer 140 exhibits a voltage dependent capacitive coupling to the underlying semiconductor substrate 120. If the boundary layer 140 is formed by a heavily doped region of semiconductor substrate, the heavily doped region should have the same type of doping as the underlying semiconductor substrate 120 (if doped). Thus, a (parasitic) pn junction between the boundary layer 140 and the semiconductor substrate 120 is avoided.

Further embodiments comprise a plurality of conductive layers 110, 111, . . . and a plurality of boundary layers 140, 141, . . . so that each boundary layer 110, 111, . . . is associated with one conductive layer of the plurality of conductive layers 140, 141, . . . .

Besides arranging the boundary layer 140 as the doped surface region of the semiconductor substrate 120 with the thickness d, it can also comprise a further (highly doped) semiconductor layer, an equipotential floating layer (as for example a metal) or other material with a high enough charge density, so that that the area charge exceeds the breakdown charge, as explained above. Since metals comprise extreme high charge density, the thickness d of the boundary layer 140 can be chosen very small. Also for these alternatives, the boundary layer 140 is formed on the surface of the semiconductor substrate 120 preferably such that the extension and location of the conductive layer 110 and the boundary layer 140 correspond to each other.

The semiconductor substrate 120 may comprise either type of doping, i.e. it can comprise a p-doped or n-doped semiconductor material. If the boundary layer 140 comprises a doped surface region of the semiconductor substrate 120, the boundary layer 140 comprises preferably the same type of doping as the doping of the semiconductor substrate 120, however with a considerably higher doping concentration (such as, for example, with a concentration of $N=10^{20}$ cm$^{-3}$ compared to $N=10^{14}$ cm$^{-3}$ of the semiconductor substrate).

What is claimed is:

1. A device comprising:
    an insulating layer separating a conductive layer from a semiconductor substrate; and
    a boundary layer for reducing a voltage dependent capacitive coupling between the conductive layer and the semiconductor substrate, wherein the boundary layer is provided at a surface of the semiconductor substrate and arranged between the semiconductor substrate and the insulating layer, wherein the boundary layer comprises an electrically conductive material or a semiconductor material comprising a doping concentration higher than a doping concentration of the semiconductor substrate, and
    wherein the boundary layer comprises a floating boundary layer, the floating boundary layer having a planar dimension corresponding substantially to or extending beyond a planar dimension of the conductive layer.

2. The device according to claim 1, wherein the boundary layer comprises a region having a thickness selected such that a lateral area charge density of the boundary layer corresponds to at least a breakdown charge density of the semiconductor substrate.

3. The device according to claim 1, wherein the boundary layer comprises a doping concentration which is at least one order of magnitude higher than the doping concentration of the semiconductor substrate.

4. The device according to claim 1, wherein the boundary layer comprises a doping concentration of at least $10^{16}$ cm$^{-3}$.

5. The device according to claim 1, wherein the semiconductor substrate comprises a doping concentration below $10^{15}$ cm$^{-3}$.

6. The device according to claim 1, wherein the boundary layer comprises a doping concentration of at least $10^{17}$ cm$^{-3}$, and wherein the semiconductor substrate comprises a doping concentration between $10^{13}$ cm$^{-3}$ and $10^{15}$ cm$^{-3}$.

7. The device according to claim 1, wherein the conductive layer is part of a high frequency device.

8. The device according to claim 1, comprising a plurality of conductive layers and a plurality of boundary layers, each boundary layer being associated with a respective one of the plurality of conductive layers.

9. The device according to claim 7, wherein the high frequency device comprises a bulk acoustic wave resonator, and wherein a bottom electrode of the bulk acoustic save resonator comprises the conductive layer.

10. A device for reducing a voltage dependent capacitive coupling between a conductive layer and a semiconductor substrate, the device comprising:
    an insulating layer arranged between a conductive layer and a semiconductor substrate; and
    a boundary layer arranged between the semiconductor substrate and the insulating layer, wherein the boundary layer is provided at a surface of the semiconductor substrate and comprises an electrically conductive material or a semiconductor material comprising a doping concentration higher than a doping concentration of the semiconductor substrate, and
    wherein the boundary layer comprises a floating boundary layer, the floating boundary layer having a planar dimension corresponding substantially to or extending beyond a planar dimension of the conductive layer.

11. The device according to claim 10, wherein the boundary layer comprises a thickness selected such that a lateral area charge density of the boundary layer corresponds to at least a breakdown charge density of the semiconductor substrate.

12. The device according to claim 10, wherein the boundary layer comprises a doping concentration which is at least one order of magnitude higher than the doping concentration of the semiconductor substrate.

13. The device according to claim 10, wherein the boundary layer comprises a doping concentration of at least $10^{16}$ cm$^{-3}$.

14. The device according to claim 10, wherein the semiconductor substrate comprises a doping concentration below $10^{15}$ cm$^{-3}$.

15. The device according to claim 10, wherein the boundary layer comprises a doping concentration of at least $10^{17}$ cm$^{-3}$, and wherein the semiconductor substrate comprises a doping concentration between $10^{13}$ cm$^{-3}$ and $10^{15}$ cm$^{-3}$.

16. The device according to claim 10, wherein the conductive layer is part of a high frequency device.

17. The device according to claim 10, comprising a plurality of conductive layers and a plurality of boundary layers, each boundary layer being associated with a respective one of the plurality of conductive layers.

18. The device according to claim 16, wherein the high frequency device comprises a bulk acoustic wave resonator, and wherein a bottom electrode of the bulk acoustic wave resonator comprises the conductive layer.

19. A high frequency device comprising:
    a conductive layer;
    a semiconductor substrate;
    an insulating between the conductive layer and the semiconductor substrate; and
    a boundary layer provided at a surface of the semiconductor substrate and arranged between the semiconductor substrate and the insulating layer, wherein the boundary layer comprises an electrically conductive material or a semiconductor material comprising a doping concentration higher than a doping concentration of the semiconductor substrate, and
    wherein the boundary layer comprises a floating boundary layer, the floating boundary layer having a planar dimension corresponding substantially to or extending beyond a planar dimension of the conductive layer.

20. The high frequency device according to claim 19, wherein the high frequency device further comprises a piezoelectric layer on the conductive layer and an upper electrode on the piezoelectric layer, thereby forming a bulk acoustic wave resonator, wherein a bottom electrode of the bulk acoustic wave resonator comprises the conductive layer.

21. The high frequency device according to claim 19, wherein the boundary layer comprises a doping concentration which is at least one order of magnitude higher than the doping concentration of the semiconductor substrate.

22. The high frequency device according to claim 19, wherein the boundary layer comprises a doping concentration higher of at least $10^{16}$ cm$^{-3}$.

23. The high frequency device according to claim 19, wherein the semiconductor substrate comprises a doping concentration below $10^{15}$ cm$^{-3}$.

24. The high frequency device according to claim 19, wherein the boundary layer comprises a doping concentration of at least $10^{17}$ cm$^{-3}$, and wherein the semiconductor substrate comprises a doping concentration between $10^{13}$ cm$^{-3}$ and $10^{15}$ cm$^{-3}$.

25. The high frequency device according to claim 19, comprising a plurality of conductive layers and a plurality of boundary layers, each boundary layer being associated with a respective one of the plurality of conductive layers.

* * * * *